(12) United States Patent
Imai et al.

(10) Patent No.: US 10,215,779 B2
(45) Date of Patent: Feb. 26, 2019

(54) NON-CONTACT VOLTAGE MEASUREMENT DEVICE

(71) Applicant: OMRON Corporation, Kyoto-shi, Kyoto (JP)

(72) Inventors: Hiroshi Imai, Nara (JP); Keiki Matsuura, Nara (JP); Hiroyuki Tokusaki, Kasugai (JP); Mao Ogimoto, Hirakata (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 15/119,400

(22) PCT Filed: Feb. 4, 2015

(86) PCT No.: PCT/JP2015/053149
§ 371 (c)(1),
(2) Date: Aug. 17, 2016

(87) PCT Pub. No.: WO2015/137018
PCT Pub. Date: Sep. 17, 2015

(65) Prior Publication Data
US 2017/0059619 A1    Mar. 2, 2017

(30) Foreign Application Priority Data
Mar. 13, 2014    (JP) ................. 2014-050655

(51) Int. Cl.
*G01R 15/16* (2006.01)
*G01R 1/07* (2006.01)
*G01R 1/18* (2006.01)

(52) U.S. Cl.
CPC .............. *G01R 15/16* (2013.01); *G01R 1/07* (2013.01); *G01R 1/18* (2013.01)

(58) Field of Classification Search
None
See application file for complete search history.

(56) References Cited

U.S. PATENT DOCUMENTS 3,444,465 A    5/1969    Teixeira
3,798,541 A    3/1974    Campbell, Jr. et al.
(Continued)

FOREIGN PATENT DOCUMENTS

EP    1249706 A2    10/2002
FR    2651889 A1    3/1991
(Continued)

OTHER PUBLICATIONS

Jacob Franden, Capacitive Sensors, Handbook of Modern Sensors: Physics, Designs, and Applications, XP055425994, ISBN: 978-1-4939-0040-4, Jan. 1, 2010, pp. 284-288, Springer New York.
(Continued)

*Primary Examiner* — Paresh H Patel
(74) *Attorney, Agent, or Firm* — Metrolexis Law Group, PLLC (57) ABSTRACT

There is provided a non-contact voltage measurement device which can precisely measure a measurement target voltage by suppressing a flow of a leakage current via a parasitic capacitance produced between an electric field shield and an electric circuit. A drive voltage applying unit applies a voltage generated from an output voltage of a low impedance unit of the electric circuit and equal to an input voltage of a high impedance unit, to a first electric field shield coated on the high impedance unit.

5 Claims, 9 Drawing Sheets

(56) References Cited

U.S. PATENT DOCUMENTS

| 5,473,244 A * | 12/1995 | Libove | G01R 1/22 |
| | | | 324/126 |
| 2002/0171454 A1 | 11/2002 | Yakabe et al. | |
| 2006/0058694 A1 | 3/2006 | Clark et al. | |
| 2010/0283539 A1 | 11/2010 | Yanagisawa | |

FOREIGN PATENT DOCUMENTS

| JP | S58-174856 A | 10/1983 |
| JP | H06-028748 U | 4/1994 |
| JP | 2001-324520 A | 11/2001 |
| JP | 2003-28900 A | 1/2003 |
| JP | 2012-163394 A | 8/2012 |
| WO | 2008/009906 A1 | 1/2008 |

OTHER PUBLICATIONS

EESR issued on Dec. 21, 2017 in a counterpart European Patent application.
Japanese Office Action dated Dec. 5, 2017 in a counterpart Japanese patent application.

* cited by examiner

FIG. 11

NON-CONTACT VOLTAGE MEASUREMENT DEVICE

TECHNICAL FIELD

The present invention relates to a non-contact voltage measurement device which measures an alternating voltage flowing in a conductive wire without contacting the conductive wire.

BACKGROUND ART

Conventionally, there is disclosed a non-contact voltage measurement device which measures an alternating voltage (measurement target voltage) flowing in conductive wires in insulated and coated wires without contacting the conductive wires. Patent Documents 1 to 3 disclose examples of such a non-contact voltage measurement device.

Generally, a non-contact voltage measurement device includes a probe and an electric circuit. When placing the probe close to the wire to produce a coupling capacitance between the probe and the wire, the non-contact voltage measurement device measures a measurement target voltage, based on a voltage signal input to the electric circuit via the probe.

However, there is a case where, in a non-contact voltage measurement device, when an electric circuit and a voltage source other than wires are capacitively coupled, noise is superimposed on a voltage signal of the electric circuit in some cases. The noise superimposed on the voltage signal causes a decrease in measurement precision of measurement target voltage. Hence, it is considered to arrange around an electric circuit an electric field shield for blocking an external electric field.

PRIOR ART DOCUMENTS

Patent Documents

Patent Document 1: "Japanese Unexamined Patent Publication No. S58-174856 (published on Oct. 13, 1983)"
Patent Document 2: "Japanese Unexamined Patent Publication No. 2003-28900 (published on Jan. 29, 2003)"
Patent Document 3: "Japanese Unexamined Patent Publication No. 2012-163394 (published on Aug. 30, 2012)"

SUMMARY OF THE INVENTION

Problems to be Solved by the Invention

However, the above conventional non-contact voltage measurement device produces a parasitic capacitance between the electric field shield and the electric circuit when the electric field shield is arranged around the electric circuit. Then, in the electric circuit, a current path passing through the parasitic capacitance is generated, and therefore a leakage current flows in this current path. As a result, there is a problem that measurement precision of measurement target voltage deteriorates.

The present invention has been made in light of the above, and an object of the present invention is to provide a non-contact voltage measurement device which can precisely measure a measurement target voltage by suppressing a flow of a leakage current via a parasitic capacitance produced between an electric field shield and an electric circuit.

Means for Solving the Problem

To solve the above problem, a non-contact voltage measurement device according to one aspect of the present invention is a non-contact voltage measurement device configured to, when placing a probe close to and in non-contact with a conductive wire to produce a coupling capacitance between the probe and the conductive wire, measure a measurement target voltage applied to the conductive wire based on a voltage signal input to an electric circuit via the probe, the electric circuit includes a first impedance unit and a second impedance unit of different impedance values, the first impedance unit in the electric circuit is arranged at a position closer to the probe than the second impedance unit is, and the non-contact voltage measurement device includes: a first electric field shield configured to block an electric field entering the first impedance unit by coating at least part of the first impedance unit; and a voltage signal applying unit configured to generate an equivoltage signal equal to a voltage signal of the first impedance unit from a voltage signal of the second impedance unit, and configured to apply the generated equivoltage signal to the first electric field shield.

According to the above configuration, a voltage signal of the first impedance unit of the electric circuit, and a voltage signal (equivoltage signal) applied to the first electric field shield are equal. That is, both of amplitudes and phases of the two voltage signals are equal. Hence, the first impedance unit of the electric circuit, and the first electric field shield have the same potential at all times.

Hence, a parasitic capacitance produced between the first impedance unit and the first electric field shield becomes substantially null, and a leakage current from the first impedance unit to the first electric field shield (or vice versa) is not produced.

Consequently, it is possible to precisely measure a measurement target voltage applied to conductive wires, based on a voltage signal input to the electric circuit via the probe.

Effect of the Invention

According to the present invention, it is possible to precisely measure a measurement target voltage by suppressing a flow of a leakage current via a parasitic capacitance produced between an electric field shield and an electric circuit.

MODE FOR CARRYING OUT THE INVENTION

[First Embodiment]

Embodiments of the present invention will be described in detail below with reference to FIG. 1.

[Configuration of Non-Contact Voltage Measurement Device 1]

A configuration of the non-contact voltage measurement device 1 (simply referred to as the voltage measurement device 1 below) according to the embodiment will be described with reference to FIG. 1. FIG. 1 is a schematic view illustrating the configuration of the voltage measurement device 1. The voltage measurement device 1 can measure a measurement target voltage $V_L$ which is an alternating (frequency: f) voltage (a voltage signal, and a voltage signal waveform) flowing in a conductive wire in a wire w (primary side wire) without contacting the conductive wire.

Figure 1:
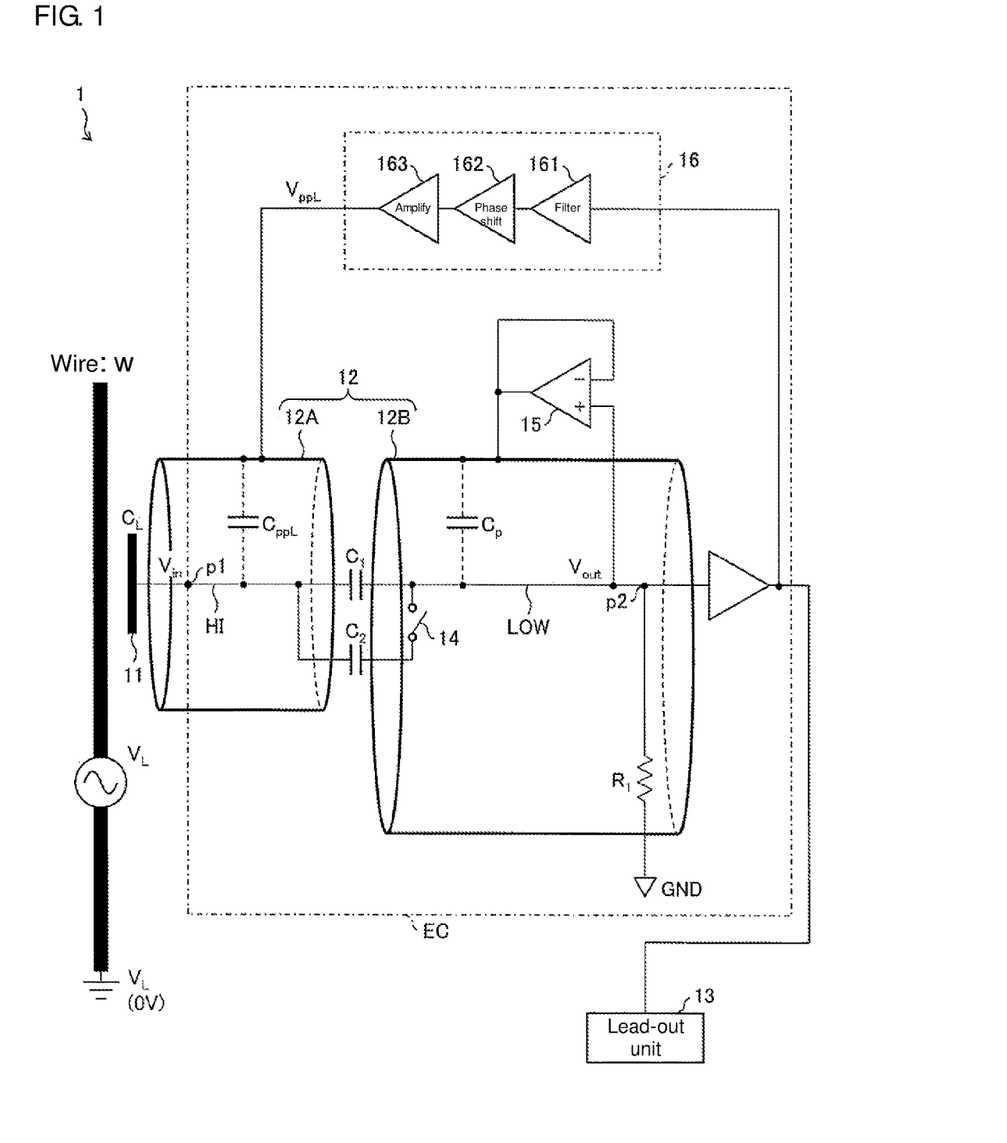
FIG. 1 is a schematic view illustrating a configuration of a non-contact voltage measurement device according to a first embodiment of the present invention.

As illustrated in FIG. 1, the voltage measurement device 1 includes a detection probe 11, an electric field shield 12, a lead-out unit 13 (voltage lead-out unit) and an electric circuit EC.

The detection probe 11 includes an electrode which can be attached in close contact with an outer circumferential surface of an insulating coating of the wire w. The detection probe 11 may include an insulating member which coats an electrode.

When the detection probe 11 and the wire w are sufficiently close, a coupling capacitance $C_L$ of a capacitance value corresponding to the measurement target voltage $V_L$ is produced between the detection probe 11 and the wire w. In the electrode of the detection probe 11, an alternate current flowing in the wire w induces an induced voltage. The induced voltage produced in the electrode of the detection probe 11 is input to the electric circuit EC electrically connected with the detection probe 11.

The electric circuit EC obtains as an input voltage $V_{in}$ the induced voltage induced in the electrode of the detection probe 11. Further, the electric circuit EC outputs a voltage at a detection point set in the electric circuit EC, as an output voltage $V_{out}$ (detection point voltage signal) to the lead-out unit 13.

The electric circuit EC includes a high impedance unit HI (first impedance unit) whose impedance value is relatively high, and a low impedance unit LOW (second impedance unit) whose impedance value is relatively low. In addition, the electric circuit EC will be described in detail below.

The electric field shield 12 blocks an electric field entering the electric circuit EC to prevent the electric circuit EC and a voltage source other than the wire w from capacitively coupling.

The electric field shield 12 may be made of metal (shield metal).

The electric field shield 12 includes a first electric field shield 12A (first electric field shield) which coats the high impedance unit HI of the electric circuit EC, and a second electric field shield 12B (second electric field shield) which coats the low impedance unit LOW.

The first electric field shield 12A and the second electric field shield 12B are insulated.

In addition, the first electric field shield 12A only needs to coat at least part of the high impedance unit HI. Further, the second electric field shield 12B only needs to coat at least part of the low impedance unit LOW.

As illustrated in FIG. 1, a parasitic capacitance $C_{ppL}$ is produced between the first electric field shield 12A and the high impedance unit HI. Further, a parasitic capacitance $C_p$ is produced between the second electric field shield 12B and the low impedance unit LOW.

The lead-out unit 13 leads out the measurement target voltage $V_L$ based on the output voltage $V_{out}$ output from the electric circuit EC. More specifically, the lead-out unit 13 leads out the measurement target voltage $V_L$ according to the following equation.

$$V_L = \frac{\frac{1}{j\omega}\left(\frac{1}{C_2} - \frac{1}{C_1}\right)v_{out1}v_{out2}/R_1}{\left(1 + \frac{C_{ppL}}{C_1}\right)v_{out1} - \left(1 + \frac{C_{ppL}}{C_2}\right)v_{out2}}$$ [Mathematical formula 1]

In this regard, $V_{out1}$ and $V_{out2}$ mean the output voltage $V_{out}$ in case of a first state and a second state (described below) of the electric circuit EC. $\omega=2\pi f$ (f is a frequency of an alternating-current flowing in the wire w) holds. Further, a parasitic capacitance produced between the second electric field shield 12B and the low impedance unit LOW is $C_p=0$. As described below, the parasitic capacitance $C_p$ is nullified by an operational amplifier 15.

[Details of Electric Circuit EC]

Hereinafter, the electric circuit EC will be described in detail.

As illustrated in FIG. 1, the electric circuit EC includes capacitors $C_1$ and $C_2$, a detection resistor $R_1$, a switch 14, the operational amplifier 15 (second voltage signal applying unit), and a drive voltage applying unit 16 (voltage signal applying unit). In this regard, the drive voltage applying unit 16 may be integrally formed with another part of the electric circuit EC or may be arranged on a substrate different from a substrate on which the electric circuit EC is arranged. In addition, a specific circuit configuration which realizes the electric circuit EC will be described in a third embodiment to a fifth embodiment.

In the electric circuit EC, both of the capacitors $C_1$ and $C_2$ are connected to an input point p1 to which the input voltage $V_{in}$ is input from the detection probe 11. The detection resistor $R_1$ is attached between the capacitors $C_1$ and $C_2$ and a reference potential point GND. The above-described detection point p2 is positioned between the capacitors $C_1$ and $C_2$ and the detection resistor $R_1$.

The input voltage $V_{in}$ input from the detection probe 11 to the electric circuit EC is divided into the capacitors $C_1$ and $C_2$ and the detection resistor $R_1$. The output voltage $V_{out}$ is equal to a divided voltage of the input voltage $V_{in}$ applied to the detection resistor $R_1$.

Capacitance values of the capacitors $C_1$ and $C_2$ and a resistance value of the detection resistor $R_1$ are determined as values which make the output voltage $V_{out}$ sufficiently small. When, for example, a capacitance value of the coupling capacitance $C_L$ is 10 pF, the measurement target voltage $V_L$ is 100 V and capacitors $C_1$=470 pF and $C_2$=47 pF and detection resistor $R_1$=1 MΩ hold, the output voltage $V_{out}$ is approximately several tens of mV to several hundreds of V (in case of f=50 Hz) and, consequently, can be measured by using a common voltmeter.

The switch 14 switches the electric circuit EC between (i) a first state where the capacitor $C_1$ is connected in series between the coupling capacitance $C_L$ and the detection resistor $R_1$, and (ii) a second state where the capacitor $C_1$ and the capacitor $C_2$ are connected in series between the coupling capacitance $C_L$ and the detection resistor $R_1$.

When the electric circuit EC is in the first state, the input voltage $V_{in}$ is divided between the detection resistor $R_1$ and the capacitor $C_1$. Meanwhile, when the electric circuit EC is in the second state, the input voltage $V_{in}$ is divided between the detection resistor $R_1$, and the capacitor $C_1$ and the capacitor $C_2$.

In addition, the switch 14 may be configured to switch the electric circuit EC between (i) a first state where the capacitor $C_1$ is connected in series between the coupling capacitance $C_L$ and the detection resistor $R_1$, and (ii) a second state where the capacitor $C_2$ is connected in series between the coupling capacitance $C_L$ and the detection resistor $R_1$. This configuration can be realized by providing switches which can be switched to on or off, between the input point p1 and the capacitor $C_1$ and between the input point p1 and the capacitor $C_2$ in the electric circuit EC.

A part of the electric circuit EC which has the same potential as that at the input point p1 will be referred to as the high impedance unit HI below. Further, a part of the electric circuit EC which has the same potential as that at the detection point p2 will be referred to as the low impedance unit LOW below.

The operational amplifier 15 connects the low impedance unit LOW and the second electric field shield 12B in the electric circuit EC. The operational amplifier 15 functions to make potentials of the second electric field shield 12B and the low impedance unit LOW the same. This is a so-called driven shield circuit technique.

Thus, in the electric circuit EC, the operational amplifier 15 makes the potentials of the low impedance unit LOW and the second electric field shield 12B the same. Hence, a current does not flow to the parasitic capacitance $C_p$ produced between the low impedance unit LOW and the second electric field shield 12B. Consequently, it is possible to exclude a probability that the parasitic capacitance $C_p$ influences a detection value of the output voltage $V_{out}$. In addition, in another embodiment, a voltage equal to the voltage (output voltage $V_{out}$) of the low impedance unit LOW may be generated from the voltage (input voltage $V_{in}$) of the high impedance unit, and the generated voltage may be applied to the second electric field shield 12B.

In addition, the voltage measurement device 1 may not include the operational amplifier 15.

The drive voltage applying unit 16 is connected to the low impedance unit LOW of the electric circuit EC. The drive voltage applying unit 16 obtains the output voltage $V_{out}$ from the low impedance unit LOW, and generates the drive voltage $V_{ppL}$ (equivoltage signal) equal to the input voltage Vin based on the obtained output voltage $V_{out}$. In other words, the drive voltage applying unit 16 generates a voltage signal waveform equal to a voltage signal waveform of the high impedance unit HI, from a voltage signal waveform of the low impedance unit LOW.

The drive voltage applying unit 16 applies the generated drive voltage $V_{ppL}$ to the first electric field shield 12A. The drive voltage $V_{ppL}$ and the input voltage $V_{in}$ are equal, and therefore the high impedance unit HI and the first electric field shield 12A to which the drive voltage $V_{ppL}$ has been applied have the same potential. That is, the drive voltage $V_{ppL}$ cancels a potential difference between the high impedance unit HI and the first electric field shield 12A.

Hence, a current does not flow to the parasitic capacitance $C_{ppL}$ produced between the high impedance unit HI and the first electric field shield 12A. In other words, the parasitic capacitance $C_{ppL}$ is substantially null. Consequently, it is possible to exclude a probability that the parasitic capacitance $C_{ppL}$ influences a detection value of the output voltage $V_{out}$.

In addition, according to the configuration illustrated in FIG. 1, the drive voltage applying unit 16 is electrically connected with the low impedance unit LOW, and directly obtains the output voltage $V_{out}$ from the low impedance unit LOW. However, the drive voltage applying unit 16 may indirectly obtain the output voltage $V_{out}$ from the lead-out unit 13 which receives an input of the output voltage $V_{out}$ from the low impedance unit LOW.

As illustrated in FIG. 1, the drive voltage applying unit 16 includes a filter 161, a phase-shift unit 162 (phase adjuster) and an amplifier 163 (amplitude adjuster).

The filter 161 cancels noise from the output voltage $V_{out}$. The filter 161 outputs to the phase-shift unit 162 the output voltage $V_{out}$ from which the noise has been canceled. The noise canceled by the filter 161 may be, for example, noise intruding the electric circuit EC from an earth wire (reference potential point GND), or noise caused by an electromagnetic wave intruding the electric circuit EC from an outside.

The phase-shift unit 162 adjusts (phase-shifts) a phase of the output voltage $V_{out}$ to equalize a phase of the output voltage $V_{out}$ input from the filter 161 and the phase of the input voltage $V_{in}$.

More specifically, the phase-shift unit 162 increases or decreases the phase of the output voltage $V_{out}$ to match the phase of the output voltage $V_{out}$ of an output stage (i.e., low impedance unit LOW) with the phase of the input voltage $V_{in}$ between the coupling capacitance $C_L$ and the capacitors $C_1$ and $C_2$ (i.e., high impedance unit HI).

A phase difference between the output voltage $V_{out}$ and the input voltage $V_{in}$ can be theoretically or experimentally calculated based on the configuration of the electric circuit EC.

For example, in the electric circuit EC illustrated in FIG. 1, the phase of the output voltage $V_{out}$ advances 90° from the phase of the input voltage $V_{in}$. Hence, the phase-shift unit 162 delays the phase of the output voltage $V_{out}$ 90° to match the phase of the output voltage $V_{out}$ and the phase of the input voltage $V_{in}$. In addition, when the filter 161 changes the phase of the output voltage $V_{out}$, the phase-shift unit 162 adjusts the phase of the output voltage $V_{out}$ by taking this change, too, into account.

Alternatively, the phase-shift unit 162 may obtain phase information of the input voltage $V_{in}$ from a detection probe different from the detection probe 11. According to this configuration, the phase-shift unit 162 obtains as the phase of the input voltage $V_{in}$ a phase of an induced voltage induced by the different detection probe close to the wire w. In addition, a coupling capacitance produced between the different detection probe and the wire w is desirably smaller than the coupling capacitance $C_L$ produced between the detection probe 11 and the wire w. Generally, when the coupling capacitance is smaller, a variation of the phase of the induced voltage becomes less. Consequently, the phase-shift unit 162 can obtain a precise phase of a little variation from the different detection probe. In addition, the phase-shift unit 162 may obtain phase information of the input voltage $V_{in}$ from the wire w.

The phase-shift unit 162 outputs the phase-shifted output voltage $V_{out}$ to the amplifier 163.

The amplifier 163 adjusts an amplitude of the output voltage $V_{out}$ to equalize an amplitude of the output voltage $V_{out}$ input from the phase-shift unit 162 and the amplitude of the input voltage $V_{in}$.

As described above, in the electric circuit EC, the output voltage $V_{out}$ is equal to the divided voltage of the input voltage $V_{in}$ applied to the detection resistor $R_1$. Further, it is possible to theoretically or experimentally calculate the divided voltage of the output voltage $V_{out}$ applied to the detection resistor $R_1$.

The amplifier 163 adjusts the amplitude of the output voltage $V_{out}$ based on the divided voltage of the output voltage $V_{out}$ applied to the detection resistor $R_1$ to equalize the amplitude of the output voltage $V_{out}$ and the amplitude of the input voltage $V_{in}$. In addition, when the filter 161 and the phase-shift unit 162 attenuate the amplitude of the output voltage $V_{out}$, the amplifier 163 adjusts the amplitude of the output voltage $V_{out}$ by taking this attenuation, too, into account.

The amplifier 163 applies the output voltage $V_{out}$ whose phase and amplitude have been adjusted, as the drive voltage $V_{ppL}$ to the first electric field shield 12A. The phase and the amplitude of the drive voltage $V_{ppL}$ are equal to the phase and the amplitude of the input voltage $V_{in}$.

In addition, when the switch 14 switches the state of the electric circuit EC, a division ratio between the capacitors $C_1$ and $C_2$ and the detection resistor $R_1$ changes, and then the amplitude of the output voltage $V_{out}$ also changes. Hence, the amplifier 163 changes an amplification degree of the output voltage $V_{out}$ in response to the switch performed by the switch 14.

[Second Embodiment]

Another embodiment of the present invention will be described below with reference to FIGS. 2 to 5. In addition, for ease of description, components having the same reference numerals as those of the members described in the first embodiment will be assigned the same reference numerals and will not be described.

When a non-contact voltage measurement device 1 (see FIG. 1) according to the first embodiment measures a measurement target voltage $V_L$, a detection probe 11 contacts or approaches a coating of a wire w (wiring coating).

However, there is a surface resistance (surface resistance component) on a top surface of a wiring coating. Hence, between the wiring w and the detection probe 11, there are a current path passing a coupling capacitance $C_L$ and, in addition, a current path passing through a surface resistance. A flow of a current in the current path passing through the surface resistance causes a decrease in precision to measure the measurement target voltage $V_L$.

Hence, in the embodiment, a configuration where, when the detection probe 11 is in contact with the surface of the wiring coating, it is possible to suppress a flow of a current in the surface resistance will be described.

Figure 2:
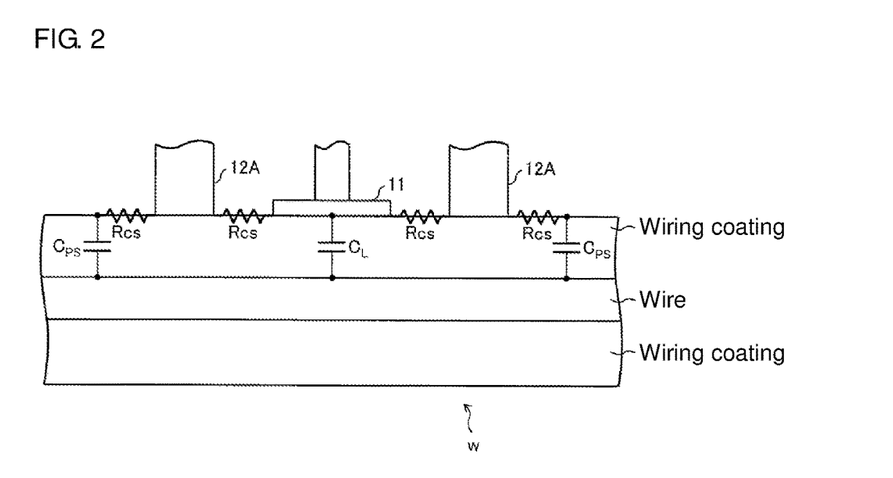
FIG. 2 is a schematic view illustrating a detection probe and a first electric field shield of a non-contact voltage measurement device according to a second embodiment of the present invention, and is a sectional view in a cross section which passes through a wire, the detection probe and the first electric field shield and is vertical to a length direction of the wire.

FIG. 2 is a schematic view illustrating the detection probe 11 and a first electric field shield 12A of the voltage measurement device 1, and is a sectional view of a cross section which passes through the wire w, the detection probe 11 and the first electric field shield 12A and which is vertical to a length direction of the wire w. FIG. 2 virtually illustrates a parasitic capacitance $C_{ps}$ between the wire w and the surface of the wiring coating, and a surface resistance $R_{cs}$ produced on the surface of the wiring coating.

As illustrated in FIG. 2, the first electric field shield 12A according to the embodiment is adjacent to and in non-contact with a side surface of the detection probe 11. The first electric field shield 12A and the detection probe 11 are electrically insulated by air or a dielectric. Further, the first electric field shield 12A is also in contact with the wiring coating when the detection probe 11 is in contact with the wiring coating.

Figure 3:
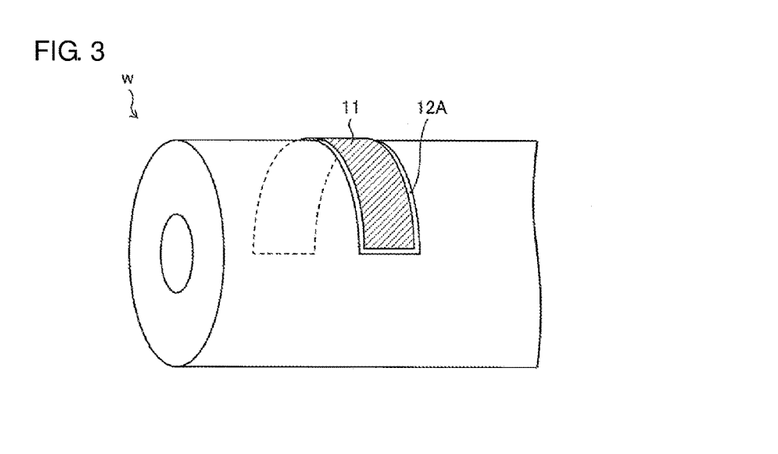
FIG. 3 is a perspective view illustrating the detection probe and the first electric field shield of the non-contact voltage measurement device according to the second embodiment of the present invention.

FIG. 3 is a perspective view illustrating a configuration of the detection probe 11 and the first electric field shield 12A attached to the wire w. As illustrated in FIG. 3, the first electric field shield 12A surrounds the side surface of the detection probe 11. In this regard, the side surface of the detection probe 11 is a surface adjacent to the surface (top surface) of the detection probe 11 which is in contact with the wiring coating.

Alternatively, the first electric field shield 12A may be in non-contact with and adjacent to part of the side surface of the detection probe 11.

As illustrated in FIG. 2, there is a current path which travels from the wire w to the first electric field shield 12A (or vice versa) via the parasitic capacitance $C_{ps}$ and the surface resistance $R_{cs}$. Hence, a current flows from the wire w to the first electric field shield 12A (or vice versa) via the parasitic capacitance $C_{ps}$ and the surface resistance $R_{cs}$.

Further, there is the surface resistance $R_{cs}$ also between the first electric field shield 12A and the detection probe 11. By the way, as described above, the first electric field shield 12A and the detection probe 11 have the same potential at all times. Hence, while the current flows from the wire w to the first electric field shield 12A, the current does not flow from the first electric field shield 12A to the detection probe 11.

Hence, it is possible to suppress the amount of a current flowing from the wire w to the detection probe 11 via the parasitic capacitance $C_{ps}$ and the surface resistance $R_{cs}$. In other words, the parasitic capacitance $C_{ps}$ is substantially null. Consequently, it is possible to precisely measure the measurement target voltage $V_L$.

[Modified Example]

During measurement of a measurement target voltage $V_L$, a detection probe 11 and a first electric field shield 12A do not need to contact a wire w. One of the detection probe 11 and the first electric field shield 12A may be in contact with the wire w. Further, a distance between the first electric field shield 12A and the wire w may be equal to or less than a distance between the detection probe 11 and the wire w.

Figure 4:
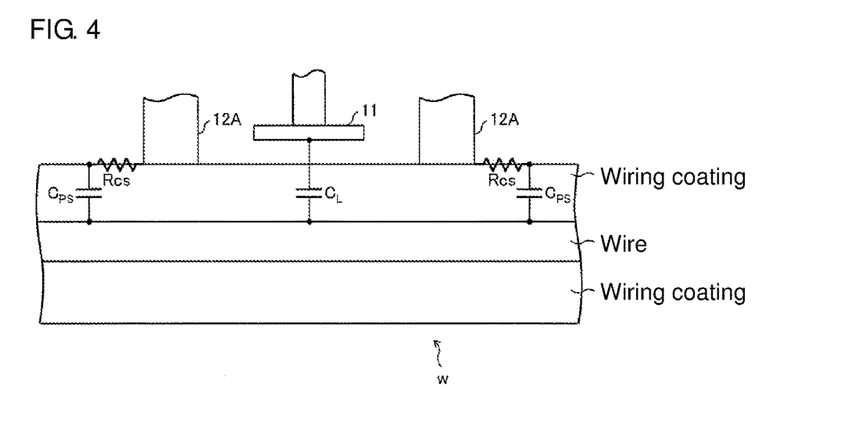
FIG. 4 is a schematic view illustrating a modified example of a detection probe and a first electric field shield of the non-contact voltage measurement device according to the second embodiment of the present invention.
Figure 5:
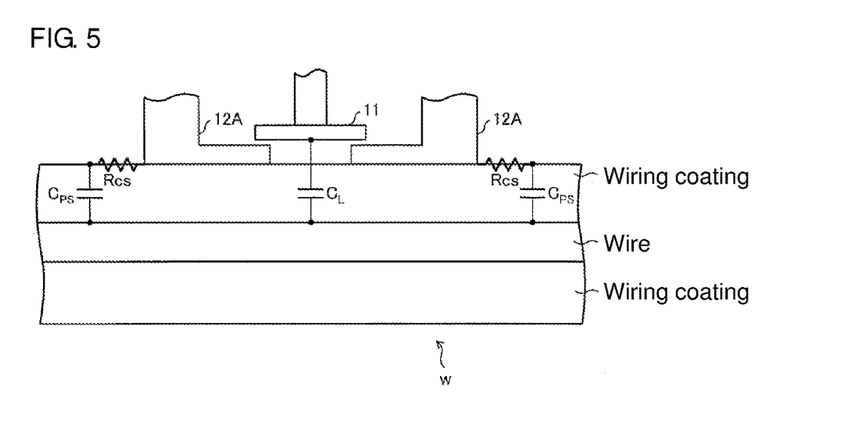
FIG. 5 is a schematic view illustrating another modified example of a detection probe and a first electric field shield of the non-contact voltage measurement device according to the second embodiment of the present invention.

FIGS. 4 and 5 illustrate configurations according to the modified example of the embodiment. In the modified example illustrated in FIG. 4, while the detection probe 11 is in non-contact with and close to the wire w, the first electric field shield 12A is in contact with the wire w. In the modified example illustrated in FIG. 5, the first electric field shield 12A comes between a surface of the detection probe 11 and the wire w.

[Third Embodiment]

Another embodiment of the present invention will be described below with reference to FIG. 6. In addition, for ease of description, components having the same reference numerals as those of the members described in the first and second embodiments will be assigned the same reference numerals and will not be described.

An example of a specific circuit configuration which realizes an electric circuit EC described in the first embodiment will be described in the embodiment.

Figure 6:
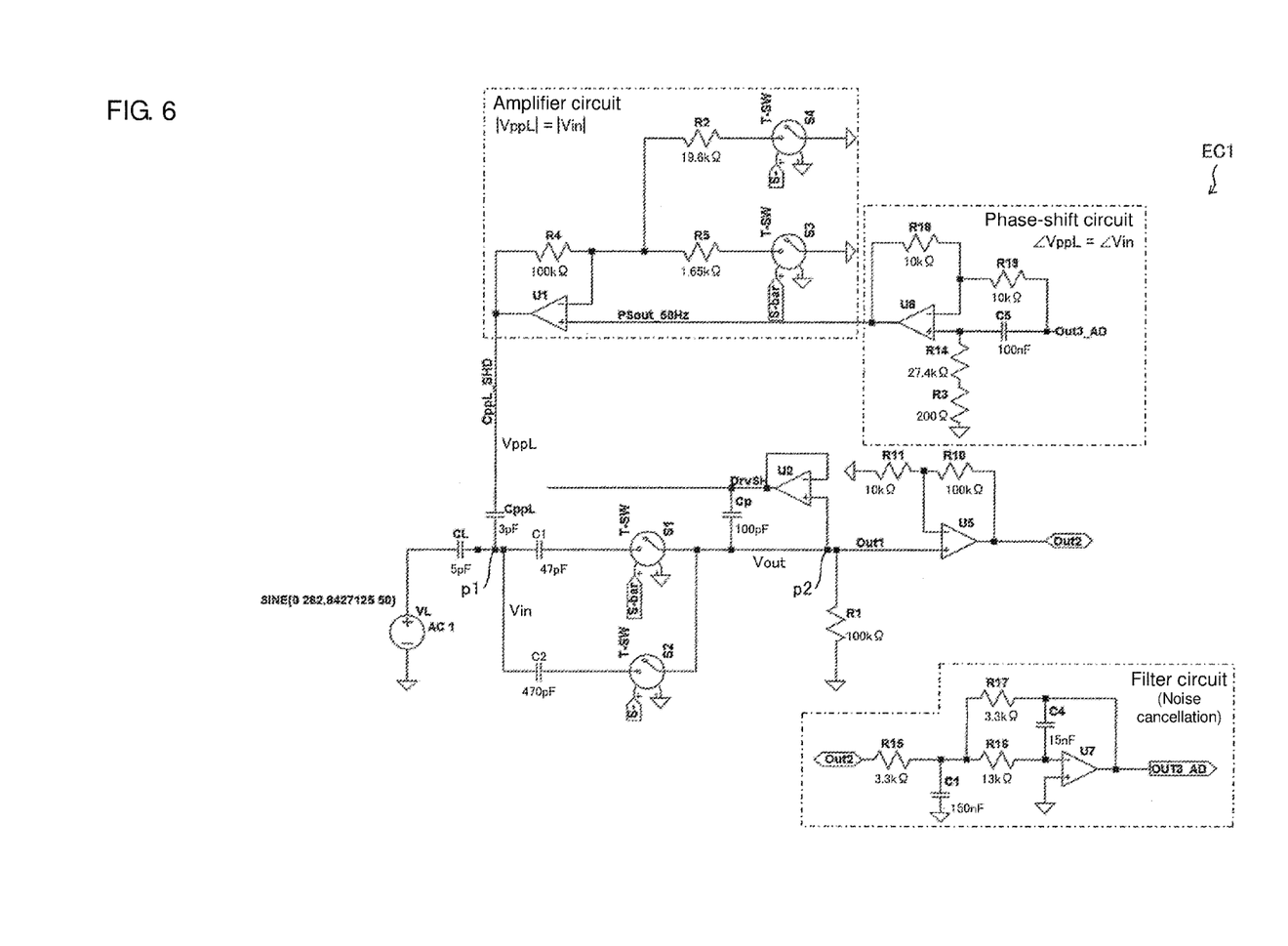
FIG. 6 is a circuit diagram of an electric circuit of a non-contact voltage measurement device according to a third embodiment of the present invention.

FIG. 6 is a circuit diagram of an electric circuit EC1 according to the embodiment. As illustrated in FIG. 6, the electric circuit EC1 is an analog circuit, and includes a phase-shift circuit and an amplifier circuit. In addition, although not illustrated, in the electric circuit EC1, an output stage "Out2" from the electric circuit EC1 and an input stage "Out3_AD" to the phase-shift circuit are electrically connected.

The phase-shift circuit corresponds to a phase-shift unit 162 according to the first embodiment. The phase-shift circuit shifts a phase of an output voltage $V_{out}$ 90° to match a phase of the output voltage $V_{out}$ with a phase of an input voltage $V_{in}$. In addition, when the phase-shift circuit shifts the phase of the output voltage $V_{out}$ of another frequency (e.g. 60 Hz) 90°, constants (a resistance value and a capacitance value) of a circuit element of the phase-shift circuit need to be reset.

The amplifier circuit corresponds to an amplifier 163 according to the first embodiment. The amplifier circuit matches an amplitude of the output voltage $V_{out}$ with an amplitude of an input voltage $V_{in}$. The amplifier circuit outputs the output voltage $V_{out}$ whose phase and amplitude have been adjusted, as a drive voltage $V_{ppL}$ ($\angle V_{ppL} = \angle V_{in}$, $|V_{ppL}| = |V_{in}|$) of the first electric field shield 12A (see FIG. 1). In addition, when the amplifier circuit matches the amplitude of the output voltage $V_{out}$ of another frequency (e.g. 60 Hz) with the amplitude of the input voltage $V_{in}$, constants (a resistance value and a capacitance value) of a circuit element of the amplifiers circuit need to be reset.

The amplifier circuit includes switches S3 and S4. When the switches S1 and S2 (corresponding to a switch 14 according to the first embodiment) are switched, the amplifier circuit switches the switches S3 and S4 to change an amplification degree of the output voltage $V_{out}$ to match the amplitude of the output voltage $V_{out}$ and the amplitude of the input voltage $V_{in}$.

As illustrated in FIG. 6, the electric circuit EC1 may further include a filter circuit which cancels noise from the output voltage $V_{out}$. The filter circuit corresponds to a filter 161 according to the first embodiment. According to this configuration, in the electric circuit EC1, the filter circuit is connected between the output stage "out2" from the electric circuit EC1 and the input stage "Out3_AD" to the phase-shift circuit. Further, according to this configuration, the phase-shift circuit corrects an adjustment amount of the phase of the output voltage $V_{out}$ by taking into account phase delay of the output voltage $V_{out}$ in the filter circuit.

[Verification of Effect]

According to the present invention, an error of a measurement target voltage $V_L$ measured by a voltage measurement device 1 is suppressed. In this regard, to verify this effect, a calculation result of an error of the measurement target voltage $V_L$ measured by the voltage measurement device 1 including the electric circuit EC1 according to the embodiment will be described.

The error of the measurement target voltage $V_L$ was calculated by taking into account a variation of constants of a circuit element (circuit part) of a drive voltage applying unit 16. More specifically, it was assumed that the resistance value of a resistor and the capacitance value of a capacitance of the drive voltage applying unit 16 had variations of 0.1% and 1%, and both of these variations were uniformly distributed.

Further, the capacitance value of the parasitic capacitance $C_{ppL}$ was set to 3 pF, and a variation of the capacitance value of the parasitic capacitance $C_{ppL}$ was set to 10% of uniform distribution. In addition, it was assumed that the variation of the output voltage $V_{out}$ was canceled by calibration, and therefore could be ignored. Further, the error of the measurement target voltage $V_L$ in case where the measurement target voltage $V_L$ was measured 100 times was calculated.

Furthermore, to make comparison with the above calculation result, the error of the measurement target voltage $V_L$ was calculated by resetting the variation of the capacitance value of the parasitic capacitance $C_{ppL}$ to 0% (no variation) without changing other conditions.

Still further, an error of the measurement target voltage $V_L$ measured by the voltage measurement device 1 including an electric circuit ECX (see FIG. 11) according to a reference example was also calculated. During this calculation, too, the capacitance value of the parasitic capacitance $C_{ppL}$ was set to 3 pF. The variation of the capacitance value of the parasitic capacitance $C_{ppL}$ was set to 10% (uniform distribution of 0% to 10%). Further, it was assumed that the variation of the output voltage $V_{out}$ was canceled by calibration, and therefore could be ignored.

Figure 10:
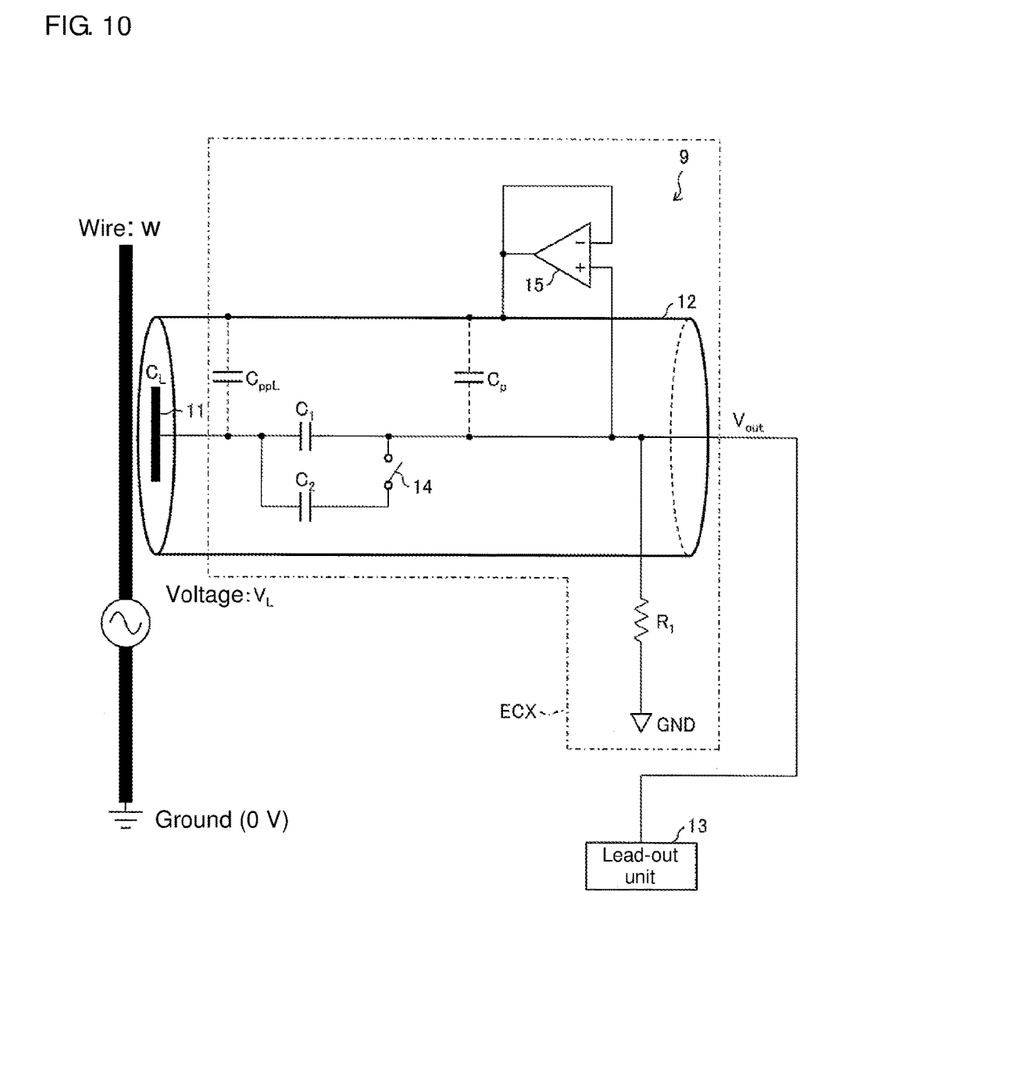
FIG. 10 is a schematic view illustrating a configuration of a non-contact voltage measurement device according to a reference example of the present invention.

FIG. 10 is a schematic view illustrating a configuration of a voltage measurement device 9 including the electric circuit ECX according to the reference example. The voltage measurement device 9 according to the reference example differs from the voltage measurement device 1 in that the voltage measurement device 9 does not include the drive voltage applying unit 16 and an electric field shield 92 is not (electrically) divided into two parts. The electric field shield 92 corresponds to a second electric field shield 12B of the voltage measurement device 1.

Figure 11:
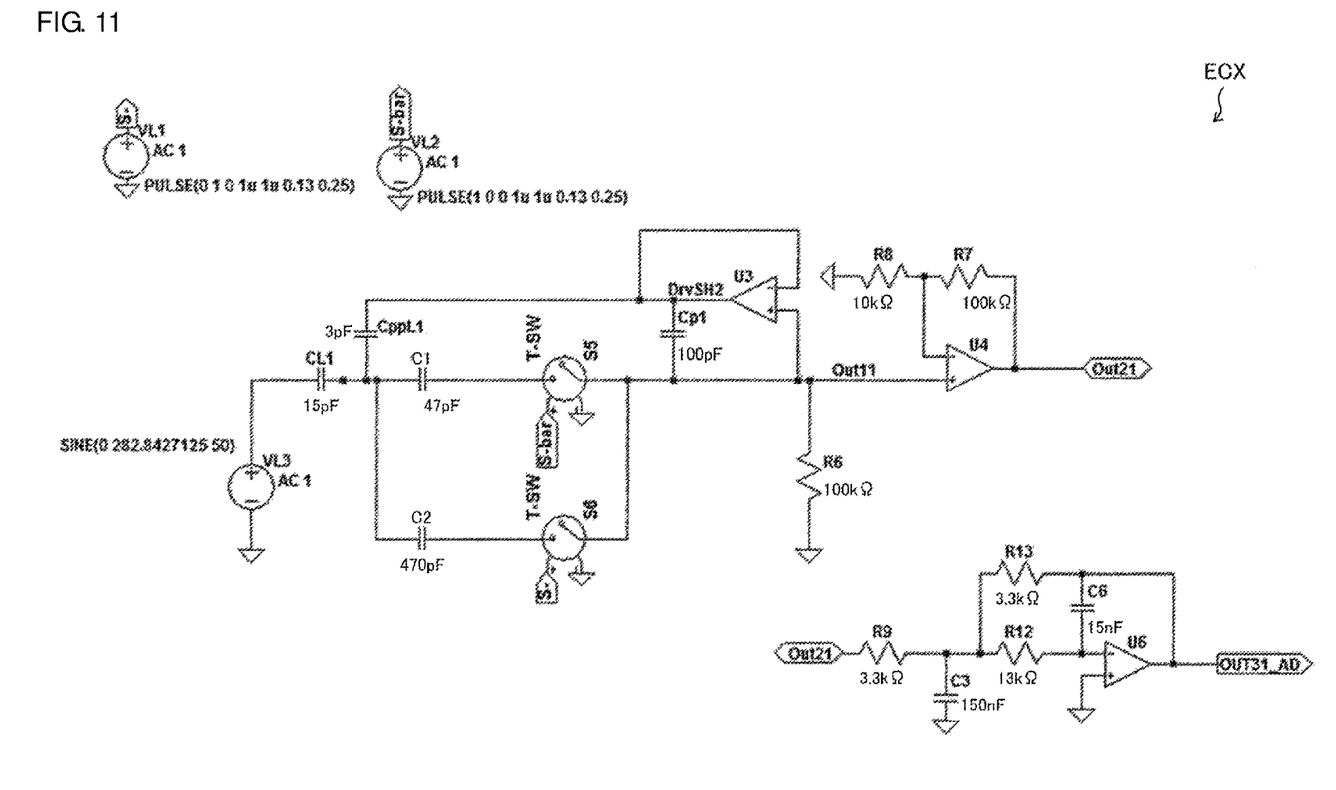
FIG. 11 is a circuit diagram of an electric circuit according to the reference example of the present invention.

FIG. 11 is a circuit diagram of the electric circuit ECX (Driven Shield Circuit) of the voltage measurement device 9 illustrated in FIG. 10. A configuration of the electric circuit ECX illustrated in FIG. 11 is the same as the configuration of the electric circuit EC1 except that the electric circuit ECX does not include a phase-shift circuit (phase-shift unit 162) and an amplifier circuit (amplifier 163).

Figure 7:
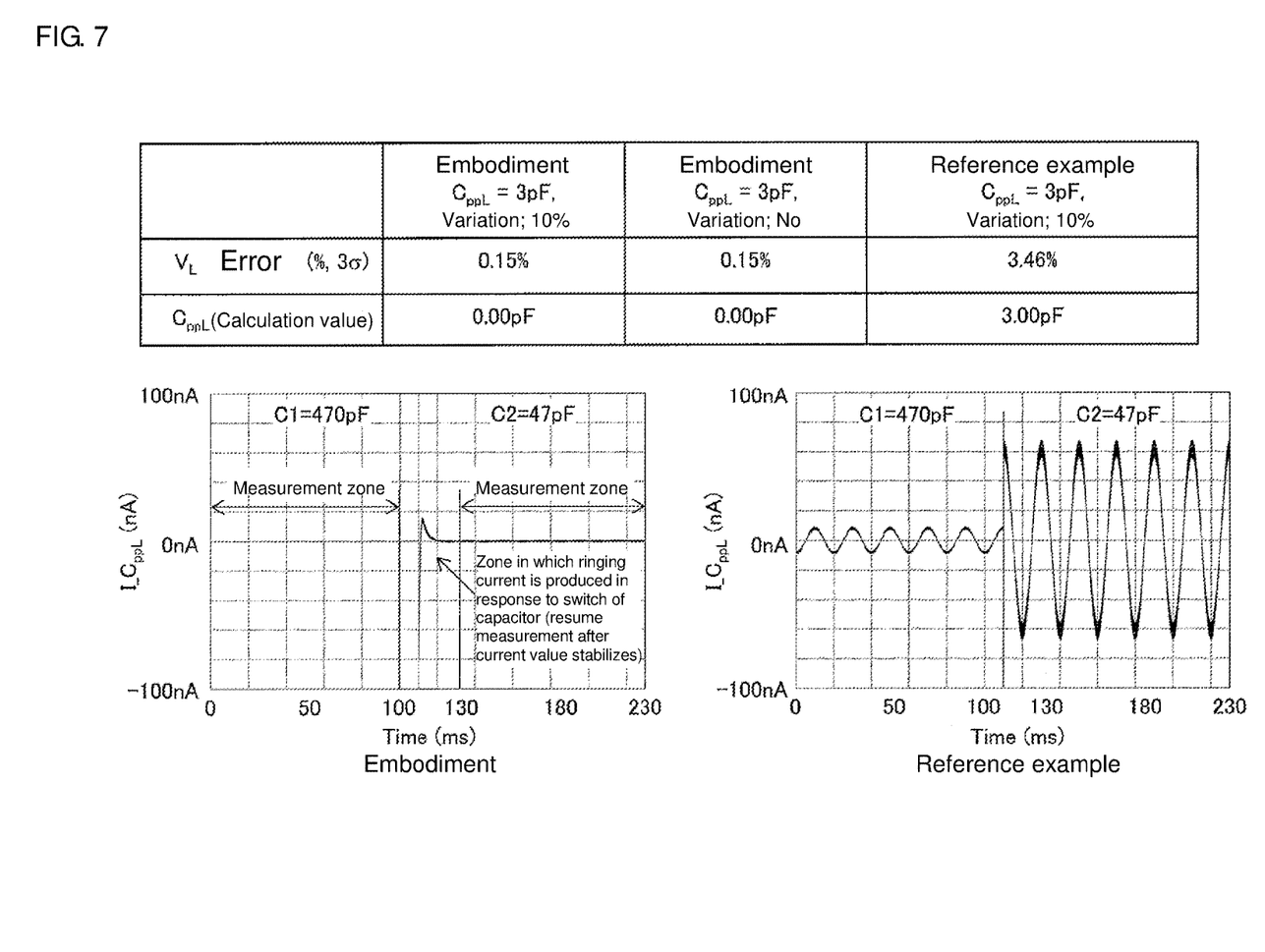
FIG. 7 illustrates a calculation result of an error of a measurement target voltage measured by the non-contact voltage measurement device according to the third embodiment of the present invention.

FIG. 7 illustrates a calculation result of the error of the measurement target voltage $V_L$. A table in FIG. 7 illustrates calculation values of an error of the measurement target voltage $V_L$, and, in addition, calculation values of the parasitic capacitance $C_{ppL}$ calculated based on the calculation values of the measurement target voltage $V_L$. Further, in FIG. 7, a left graph indicates a temporal change of a leakage current $I\_C_{ppL}$ flowing via the parasitic capacitance $C_{ppL}$ of the electric circuit EC1, and a right graph indicates a temporal change of the leakage current $I\_C_{ppL}$ flowing via the parasitic capacitance $C_{ppL}$ of the electric circuit ECX.

As illustrated in the table in FIG. 7, the error (0.15%) of the measurement target voltage $V_L$ measured by the voltage measurement device 1 including the electric circuit EC1 is 1/20 or less compared to an error (3.46%) of the measurement target voltage $V_L$ measured by the voltage measurement device 1 including the electric circuit ECX.

In addition, the error of the measurement target voltage $V_L$ measured by the voltage measurement device 1 including the electric circuit EC1 derives from a variation of constants (a resistance value and a capacitance value) of a circuit element of the drive voltage applying unit 16 of the electric circuit EC1. This error can be canceled by initial calibration.

Further, as illustrated in the table in FIG. 7, according to the configuration according to the embodiment, the error (0.15%) of the measurement target voltage $V_L$ is constant irrespectively of whether or not the parasitic capacitance $C_{ppL}$ has a variation. Furthermore, according to the configuration according to the embodiment, a calculation value of the parasitic capacitance $C_{ppL}$ is substantially zero (0.00 pF).

Hence, according to the configuration according to the embodiment, the parasitic capacitance $C_{ppL}$ is substantially null.

In addition, that the error of the measurement target voltage $V_L$ is suppressed has been described based on the configuration according to the embodiment. However, even a configuration according to the other embodiments can suppress the error of the measurement target voltage $V_L$ likewise.

[Fourth Embodiment]

Another embodiment of the present invention will be described below with reference to FIG. 8. In addition, for ease of description, components having the same reference numerals as those of the members described in the first to third embodiments will be assigned the same reference numerals and will not be described.

In the third embodiment, a configuration where a phase-shift unit 162 and an amplifier 163 according to the first embodiment are realized by a phase-shift circuit and an amplifier circuit has been described.

In the embodiment, a configuration where the phase-shift unit 162 and the amplifier 163 according to the first embodiment are realized by one integration circuit will be described. Hence, according to the configuration according to the embodiment, it is possible to simplify an electric circuit compared to the configuration according to the third embodiment.

Figure 8:
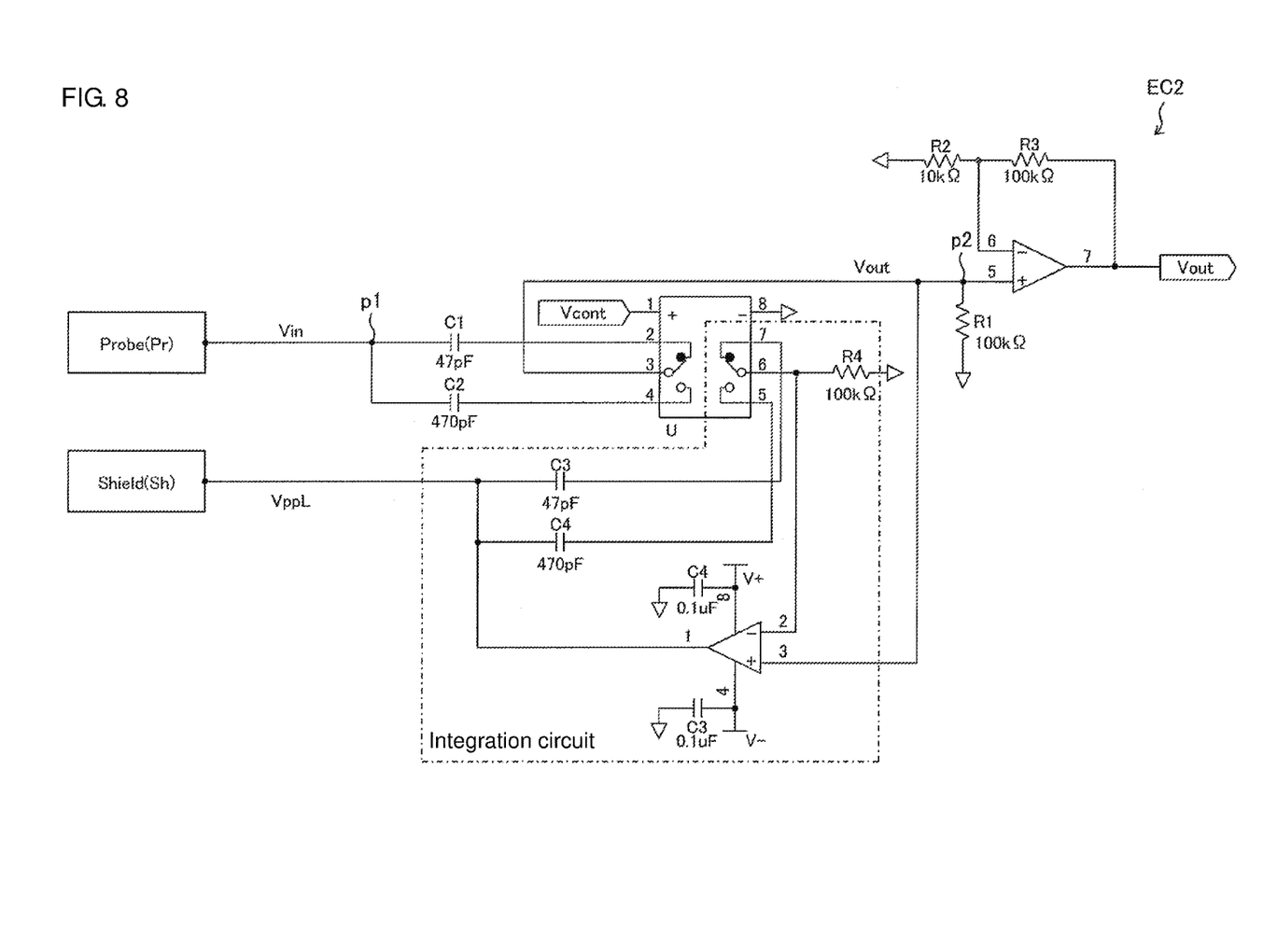
FIG. 8 is a circuit diagram of an electric circuit EC2 of a non-contact voltage measurement device according to a fourth embodiment of the present invention.

FIG. 8 is a circuit diagram of an electric circuit EC2 according to the embodiment. As illustrated in FIG. 8, the electric circuit EC2 is an analog circuit, and includes an integration circuit. In FIG. 8, "Probe (Pr)" corresponds to a detection probe 11 (see FIG. 1). Further, in FIG. 8, "Shield (Sh)" corresponds to a first electric field shield 12A (see FIG. 1).

The integration circuit corresponds to the phase-shift unit 162 and the amplifier 163 according to the first embodiment. That is, the integration circuit shifts a phase of an output voltage $V_{out}$ 90° to match a phase of the output voltage $V_{out}$ with a phase of an input voltage $V_{in}$. Further, the integration circuit matches an amplitude of the output voltage $V_{out}$ with an amplitude of the input voltage $V_{in}$. The integration circuit outputs the output voltage $V_{out}$ whose phase shift and amplitude have been adjusted, as the drive voltage $V_{ppL}$ to the first electric field shield 12A.

In addition, a capacitor C3 and a capacitor C4 illustrated in FIG. 8 may be connected in parallel to a resistor to increase the degree of stability of the integration circuit.

[Fifth Embodiment]

Another embodiment of the present invention will be described below with reference to FIG. 9. In addition, for ease of description, components having the same reference numerals as those of the members described in the first to fourth embodiments will be assigned the same reference numerals and will not be described.

In the third to fourth embodiments, a configuration where a drive voltage applying unit 16 is realized by an analog circuit has been described. However, the drive voltage applying unit 16 may be realized by a digital circuit. The digital circuit has an advantage that the digital circuit is hardly influenced by noise compared to the analog circuit.

In the embodiment, a configuration where the phase-shift unit 162 of the drive voltage applying unit 16 is realized by the digital circuit will be described as an example.

Figure 9:
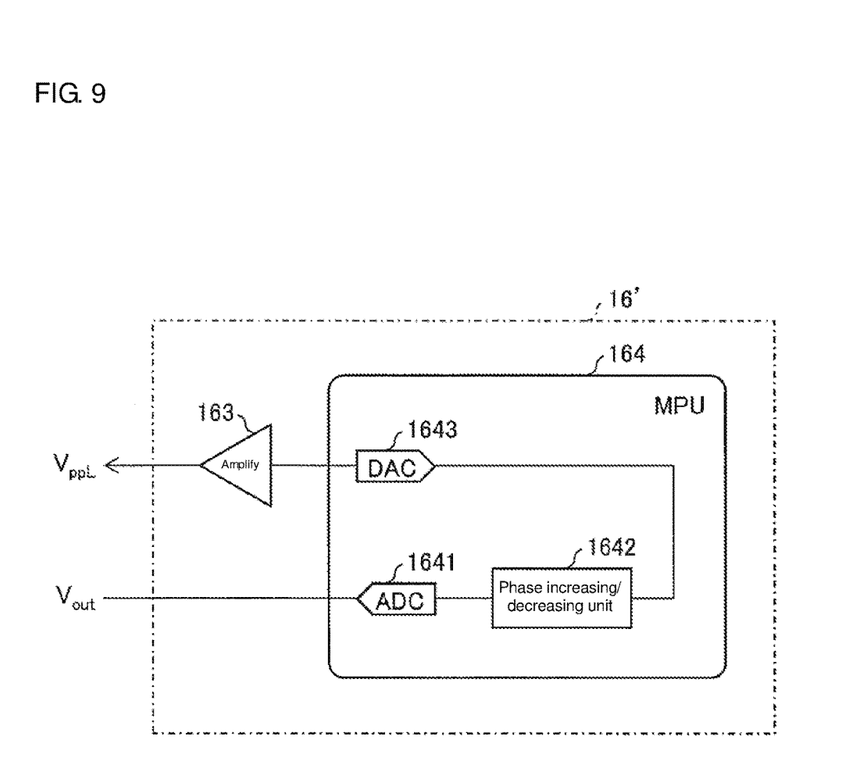
FIG. 9 is a schematic view of a drive voltage applying unit of a non-contact voltage measurement device according to a fifth embodiment of the present invention.

FIG. 9 is a schematic view of a drive voltage applying unit 16' according to the embodiment. As illustrated in FIG. 9, the drive voltage applying unit 16' includes a phase-shift MPU 162' and the amplifier 163. The phase-shift MPU 162' includes an AD converter 1641, a phase increasing/decreasing unit 1642 and a DA converter 1643.

The AD converter 1641 obtains the output voltage $V_{out}$ from a low impedance unit LOW, and AD-converts the obtained output voltage $V_{out}$. Further, the AD converter 1641 outputs the output voltage $V_{out}$ converted into a digital signal, to the phase increasing/decreasing unit 1642.

The phase increasing/decreasing unit 1642 increases/decreases (adjusts) a phase of the output voltage $V_{out}$ to equalize the phase of the output voltage $V_{out}$ input from the AD converter 1641 and the phase of the input voltage $V_{in}$. Subsequently, the phase increasing/decreasing unit 1642 outputs the output voltage $V_{out}$ to the DA converter 1643. For example, the phase increasing/decreasing unit 1642 may adjust the phase of the output voltage $V_{out}$ by the same method as that of the phase-shift unit 162 according to the first embodiment.

The DA converter 1643 converts the output voltage $V_{out}$ input from the phase increasing/decreasing unit 1642 from a digital signal into an analog signal. Further, the DA converter 1643 outputs to the amplifier 163 the output voltage $V_{out}$ converted into the analog signal.

The amplifier 163 amplifies (adjusts) an amplitude of the output voltage $V_{out}$ to equalize the amplitude of the output voltage $V_{out}$ received from the DA converter 1643 and an amplitude of the input voltage $V_{in}$. Subsequently, the amplifier 163 applies the output voltage $V_{out}$ whose phase and amplitude have been adjusted, as a drive voltage $V_{ppL}$ to the first electric field shield 12A. In addition, an amplifier circuit which realizes the amplifier 163 may also be realized by a digital circuit.

[Implementation Example Using Software]

Control blocks (the phase-shift unit 162 and the amplifier 163 in particular) of the non-contact voltage measurement device 1 may be realized by a logic circuit (hardware) formed on an integrated circuit (IC chip) or may be realized by software by using a CPU (Central Processing Unit).

In case of the latter, the non-contact voltage measurement device 1 includes a CPU which executes a command of a program which is software which realizes each function, a ROM (Read Only Memory) or a storage device (referred to as a recording medium) in which the program and various items of data are recorded in a computer (or CPU)-readable manner, and a RAM (Random Access Memory) which expands the program. Further, the computer (or CPU) reads the program from the recording medium and executes the program, so that the object of the present invention is achieved. As the recording medium, a "non-transitory tangible medium" such as a tape, a disk, a card, a semiconductor memory and a programmable logic circuit can be used. Further, the program may be supplied to the computer via an arbitrary transmission medium (e.g. a communication network or a broadcast wave) which can transmit the program. In addition, the present invention can be realized by a mode of a data signal embodied by electronically transmitting the program and embedded in a carrier wave.

The present invention is not limited to each of the above embodiments, and can be variously changed in the scope of the claims. The embodiments obtained by optionally combining technical units disclosed in the different embodiments are also included in the technical scope of the present invention.

[Conclusion]

As described above, a non-contact voltage measurement device according to one aspect of the present invention is a non-contact voltage measurement device configured to, when placing a probe close to and in non-contact with a conductive wire to produce a coupling capacitance between the probe and the conductive wire, measure a measurement target voltage applied to the conductive wire based on a voltage signal input to an electric circuit via the probe, and the electric circuit includes a first impedance unit and a second impedance unit of different impedance values, the first impedance unit in the electric circuit is arranged at a position closer to the probe than the second impedance unit is, and the non-contact voltage measurement device includes: a first electric field shield configured to block an electric field entering the first impedance unit by coating at least part of the first impedance unit; and a voltage signal applying unit configured to generate an equivoltage signal equal to a voltage signal of the first impedance unit from a voltage signal of the second impedance unit, and configured to apply the generated equivoltage signal to the first electric field shield.

According to the above configuration, a voltage signal of the first impedance unit of the electric circuit, and a voltage signal (equivoltage signal) applied to the first electric field shield are equal. That is, both of amplitudes and phases of the two voltage signals are equal. Hence, the first impedance unit of the electric circuit, and the first electric field shield have the same potential at all times.

Hence, a parasitic capacitance produced between the first impedance unit and the first electric field shield becomes substantially null, and a leakage current from the first impedance unit to the first electric field shield (or vice versa) is not produced.

Consequently, it is possible to precisely measure a measurement target voltage applied to conductive wires, based on a voltage signal input to the electric circuit via the probe.

In addition, it is necessary to make an impedance value of the second impedance unit lower than an impedance value of the first impedance unit to allow the voltage signal applying unit to generate a voltage signal of the first impedance unit from a voltage signal of the second impedance unit.

The non-contact voltage measurement device according to another aspect of the present invention may further include a voltage lead-out unit configured to lead out the measurement target voltage based on a detection point voltage signal detected at a detection point set in the second impedance unit, and the voltage signal applying unit may obtain the detection point voltage signal as the voltage signal of the second impedance unit.

According to the configuration, an equivoltage signal is generated from a detection point voltage signal detected at a detection point set in the second impedance unit of the electric circuit.

The detection point voltage signal is a voltage signal measured to lead out a measurement target voltage. Therefore, the electric circuit includes a component which outputs the detection point voltage signal at all times. Hence, it is not necessary to add a new circuit to the electric circuit to output the voltage signal of the second impedance unit.

Consequently, it is possible to simplify a configuration of the electric circuit.

The non-contact voltage measurement device according to another aspect of the present invention may further include: a second electric field shield, coating at least part of the second impedance unit and insulated from the first electric field shield; and a second voltage signal applying unit configured to apply to the second electric field shield an equivoltage signal equal to the voltage signal of the second impedance unit.

According to the configuration, a voltage signal equal to the voltage signal of the second impedance unit of the electric circuit is applied to the second electric field shield. Hence, the second impedance unit of the electric circuit and the second electric field shield have the same potential, and therefore there is no current flowing in a parasitic capacitance produced between the second impedance unit and the second electric field shield. Hence, it is possible to suppress a leakage current from the electric circuit to the second electric field shield. The second voltage signal applying unit may include, for example, an operational amplifier.

In the non-contact voltage measurement device according to another aspect of the present invention, when the measurement target voltage is measured, a surface of the probe closest to the conductive wire may be a top surface, and when a surface of the probe adjacent to the top surface is a side surface, the first electric field shield may be adjacent to and in non-contact with at least part of the side surface.

According to the above configuration, at least part of the side surface of the probe and the first electric field shield are adjacent. Hence, when the measurement target voltage is measured, at least part of a surface current flowing in the top surface of the coating of the conductive wire flows in the first electric field shield, not in the probe.

Consequently, compared to a configuration where the surface current flows only in the probe, it is possible to suppress the amount of the surface current flowing in the probe.

In the non-contact voltage measurement device according to another aspect of the present invention, the voltage signal applying unit may include: (i) an amplitude adjuster configured to adjust an amplitude of the voltage signal of the second impedance unit to equalize to an amplitude of the voltage signal of the first impedance unit, and (ii) a phase adjuster configured to adjust a phase of the voltage signal of the second impedance unit to equalize to a phase of the voltage signal of the first impedance unit.

According to the above configuration, an amplitude and a phase of the voltage signal of the second impedance unit are adjusted to match with an amplitude and a phase of the voltage signal of the first impedance unit, respectively. Thus, an equivoltage signal equal to the voltage signal of the first impedance unit is generated from the voltage signal of the second impedance unit.

In addition, amplitude adjustment and phase adjustment of the voltage signal may be realized by a single member of the voltage signal applying unit. For example, amplitude adjustment and phase adjustment of the voltage signal may be realized by an integration circuit.

The non-contact voltage measurement device according to each aspect of the present invention may be realized by a computer. In this case, a control program of the non-contact voltage measurement device which causes a computer to operate as each unit of the non-contact voltage measurement device to realize the non-contact voltage measurement device, and a computer-readable recording medium on which the control program is recorded are included in the scope of the present invention.

INDUSTRIAL APPLICABILITY

The present invention can be used for a voltage measurement device which measures an alternating voltage flowing in a conductive wire of an insulated and coated wire without contacting the conductive wire.

DESCRIPTION OF SYMBOLS

HI high impedance unit (first impedance unit)
LOW low impedance unit (second impedance unit)
$V_{out}$ output voltage (detection point voltage signal)
$V_L$ measurement target voltage
1 non-contact voltage measurement device
11 detection probe (probe)
12A first electric field shield (first electric field shield)
12B second electric field shield (second electric field shield)
13 lead-out unit
15 operational amplifier (second voltage signal applying unit)
16 drive voltage applying unit (voltage signal applying unit)
162 phase-shift unit (phase adjuster)
163 amplifier (amplitude adjuster)

The invention claimed is:

1. A non-contact voltage measurement device configured to, when placing a probe close to and in non-contact with a conductive wire to produce a coupling capacitance between the probe and the conductive wire, measure a measurement target voltage applied to the conductive wire based on a voltage signal input to a first impedance unit of an electric circuit via the probe, wherein
the electric circuit includes the first impedance unit and a second impedance unit of different impedance values, wherein the first impedance unit has a higher impedance than the second impedance unit,
the first impedance unit in the electric circuit is arranged at a position closer to the probe than the second impedance unit, and
the non-contact voltage measurement device comprises:
a first electric field shield configured to block an electric field entering the first impedance unit by coating at least part of the first impedance unit; and
a voltage signal applying unit configured to:
generate an equivoltage signal equal to the voltage signal input to the first impedance unit, the voltage signal capacitively coupled to the second impedance unit, the equivoltage signal generated from a voltage signal of the second impedance unit based on the capacitively coupled voltage signal, and
apply the generated equivoltage signal to the first electric field shield to cancel a potential difference between the first impedance unit and the first electric field shield and prevent a current flowing to a parasitic capacitance between the first impedance unit and the first electric field shield.

2. The non-contact voltage measurement device according to claim 1, further comprising a voltage lead-out unit configured to lead out the measurement target voltage based on a detection point voltage signal detected at a detection point set in the second impedance unit,
wherein the voltage signal applying unit obtains the detection point voltage signal as the voltage signal of the second impedance unit.

3. The non-contact voltage measurement device according to claim 1, further comprising:
a second electric field shield coating at least part of the second impedance unit and insulated from the first electric field shield; and
a second voltage signal applying unit configured to apply to the second electric field shield an equivoltage signal equal to the voltage signal of the second impedance unit.

4. The non-contact voltage measurement device according to claim 1, wherein
the conductive wire is covered with a coating,
when the measurement target voltage is measured, a surface of the probe closest to the coating is a top surface, and
when a surface of the probe adjacent to the top surface is a side surface,
the first electric field shield is adjacent to and in non-contact with at least part of the side surface.

5. The non-contact voltage measurement device according to claim 1, wherein
the voltage signal applying unit comprises:
(i) an amplitude adjuster configured to adjust an amplitude of the voltage signal of the second impedance unit to equalize to an amplitude of the voltage signal of the first impedance unit, and
(ii) a phase adjuster configured to adjust a phase of the voltage signal of the second impedance unit to equalize to a phase of the voltage signal of the first impedance unit.

* * * * *